(12) United States Patent
Kim et al.

(10) Patent No.: US 7,868,527 B2
(45) Date of Patent: Jan. 11, 2011

(54) POLARIZER, METHOD OF MANUFACTURING THE SAME, AND FLAT PANEL DISPLAY DEVICE INCLUDING THE POLARIZER

(75) Inventors: Won-Jong Kim, Suwon-si (KR);
Yong-Tak Kim, Suwon-si (KR);
Jin-Baek Choi, Suwon-si (KR);
Jong-Hyuk Lee, Suwon-si (KR);
Jae-Heung Ha, Suwon-si (KR);
Yoon-Hyeung Cho, Suwon-si (KR);
Byoung-Duk Lee, Suwon-si (KR);
Sun-Young Lee, Suwon-si (KR);
So-Young Lee, Suwon-si (KR); Min-Ho Oh, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 799 days.

(21) Appl. No.: 11/740,241

(22) Filed: Apr. 25, 2007

(65) Prior Publication Data
US 2008/0111483 A1     May 15, 2008

(30) Foreign Application Priority Data
Nov. 10, 2006   (KR) ...................... 10-2006-0111247

(51) Int. Cl.
*H01J 5/16*     (2006.01)
*G02B 5/30*     (2006.01)

(52) U.S. Cl. ...................... 313/112; 313/113; 359/486; 359/487; 359/489; 359/359

(58) Field of Classification Search .......... 359/486–489
See application file for complete search history.

(56) References Cited

U.S. PATENT DOCUMENTS

| 6,654,168 | B1 * | 11/2003 | Borrelli et al. | 359/487 |
| 7,282,265 | B2 * | 10/2007 | Fukushima | 428/408 |
| 2004/0080926 | A1 * | 4/2004 | Chen et al. | 362/31 |
| 2004/0218270 | A1 * | 11/2004 | Wang | 359/489 |
| 2008/0048558 | A1 * | 2/2008 | Song et al. | 313/504 |

FOREIGN PATENT DOCUMENTS

JP     2001102792 A * 4/2001

OTHER PUBLICATIONS

Machine English translation of JP 2001102792 to Kondo et al., Apr. 13, 2001.*

* cited by examiner

*Primary Examiner*—Sikha Roy
(74) *Attorney, Agent, or Firm*—Christie, Parker & Hale, LLP

(57) ABSTRACT

A polarizer adapted to improve contrast and visibility of a display device, a method of manufacturing the polarizer, and a flat panel display device including the polarizer. In one embodiment, the polarizer includes a base and a plurality of grids disposed in a stripe pattern on the base. Here, the grids are separated from each other and formed of metal-containing graphite.

11 Claims, 15 Drawing Sheets

EXTERNAL LIGHT

EXTERNAL LIGHT

EXTERNAL LIGHT

POLARIZER, METHOD OF MANUFACTURING THE SAME, AND FLAT PANEL DISPLAY DEVICE INCLUDING THE POLARIZER

CROSS-REFERENCE TO RELATED PATENT APPLICATION

This application claims priority to and the benefit of Korean Patent Application No. 10-2006-0111247, filed on Nov. 10, 2006, in the Korean Intellectual Property Office, the entire content of which is incorporated herein by reference.

BACKGROUND OF THE INVENTION

1. Field of the Invention

The present invention relates to a polarizer, a method of manufacturing the same, and a flat panel display device including the polarizer.

2. Description of the Related Art

Recently, portable flat panel display devices have begun to replace display apparatuses such as cathode ray tubes (CRT). These flat panel display devices include organic and inorganic light emitting display devices. These light emitting display devices have attracted much attention because they are self-luminous displays, and have a wide viewing angle, high contrast, and short response time. In addition, as compared with inorganic light emitting display devices, organic light emitting display devices that include an emitting layer formed of an organic material have higher luminance, lower driving voltage, shorter response time, and the ability to display a wider range of colors.

Flat panel display devices are usually portable and thus can be used outdoors. For this purpose, flat panel display devices are manufactured to be lightweight and thin. When using such a flat panel display device outdoors, the contrast and the visibility are reduced due to the reflection of external light (e.g., sunlight). This problem may be more serious in organic light emitting display devices due to the reflection of sunlight from a metal reflective layer therein.

To address this problem, a circular polarizing plate can be arranged on a surface of an organic light emitting display device. Such a circular polarizing plate typically includes a thin, linear polarizing plate with a metallic wire grid. However, the wire grid reflects external light due to its inherent metallic characteristic. Therefore, there is a limit to how much the contrast of an organic light emitting display device can be improved using such a grid.

SUMMARY OF THE INVENTION

An aspect of an embodiment of the present invention is directed to a polarizer that can improve contrast and visibility of a flat panel display device, a method of manufacturing the same, and a flat panel display device including the polarizer According to an embodiment of the present invention, there is provided a polarizer including: a base; and a plurality of grids disposed in a stripe pattern on the base, wherein the grids are separated from each other and include metal-containing graphite.

The metal-containing graphite forming may contain from about 1 to about 10% by weight of metal. The metal of the grids may be selected from the group consisting of aluminum, silver, tungsten, gold, chromium, and combinations thereof.

The polarizer may further include a low-reflection layer disposed on a surface of each of the grids that faces a direction in which external light is incident. The low-reflection layer may have a thickness ranging from about 50 to about 1000 Å. The low-reflection layer may include hydrogen, nitrogen, and combinations thereof.

According to another embodiment of the present invention, there is provided a method of manufacturing a polarizer, the method including: preparing a base; and forming a plurality of grids in a stripe pattern on the base, wherein the grids are separated from each other and are formed of metal-containing graphite.

The forming of the grids may include doping graphite with metal. The doping of graphite with metal may include co-depositing graphite and metal.

According to another embodiment of the present invention, there is provided an organic light-emitting display device including: a substrate; an organic light-emitting device disposed on the substrate and adapted to generate an image; a sealing member disposed on the organic light-emitting device; a quarter-wave layer disposed on at least one of the substrate, the organic light-emitting device, or the sealing member; and a linear polarization layer disposed on at least one of the substrate, the organic light-emitting device, or the sealing member, wherein the linear polarization layer is disposed closer to a region of the organic light-emitting display device in which an image is displayed than the quarter-wave layer is disposed to the same region, and includes a plurality of grids, and wherein the grids include metal-containing graphite. In one embodiment, the quarter-wave layer is disposed on at least one of a surface of the substrate, a surface of the organic light-emitting device, or a surface of the sealing member, and the linear polarization layer is disposed on at least one of another surface of the substrate opposite to the surface on which the quarter-wave layer is disposed, another surface of the organic light-emitting device opposite to the surface on which the quarter-wave layer is disposed, or anther surface of the sealing member opposite to the surface on which the quarter-wave layer is disposed.

The image may be displayed toward the substrate, the linear polarization layer may be disposed on the substrate, the quarter-wave layer may be disposed on the linear polarization layer, and the organic light-emitting device may be disposed on the quarter-wave layer.

The image may be displayed toward the substrate, the quarter-wave layer may be disposed on a surface of the substrate, the organic light-emitting device may be disposed on the quarter-wave layer, and the linear polarization layer may be disposed on another surface of the substrate that is opposite to the surface of the substrate on which the quarter-wave layer is disposed.

The image may be displayed toward the substrate, and the quarter-wave layer and the linear polarization layer may be sequentially disposed on a surface of the substrate that is opposite to another surface of the substrate on which the organic light-emitting device is disposed.

The image may be displayed toward the sealing member, the quarter-wave layer may be disposed on the organic light-emitting device, and the linear polarization layer may be disposed on the quarter-wave layer.

The image may be displayed toward the sealing member, and the organic light-emitting display device may further include a protective layer disposed between the organic light-emitting device and the quarter-wave layer.

The image may be displayed toward the sealing member, and the quarter-wave layer and the linear polarization layer may be sequentially disposed on a surface of the sealing member that is opposite to another surface of the sealing member on which the organic light-emitting device is disposed.

The image may be displayed toward the sealing member, the quarter-wave layer may be disposed on a surface of the sealing member that faces the organic light-emitting device, and the linear polarization layer may be disposed on another surface of the sealing member that is opposite to the surface of the sealing member on which the quarter-wave layer is disposed.

The image may be displayed toward the sealing member, the linear polarization layer may be disposed on a surface of the sealing member that faces the organic light-emitting device, and the quarter-wave layer may be disposed on a surface of the linear polarization layer that faces the organic light-emitting device.

The image may be displayed toward the sealing member, and the organic light-emitting display device may further include a reflection layer disposed between the substrate and the organic light-emitting device, wherein the quarter-wave layer may be disposed between the reflection layer and the organic light-emitting device, and the linear polarization layer may be disposed on the organic light-emitting device.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
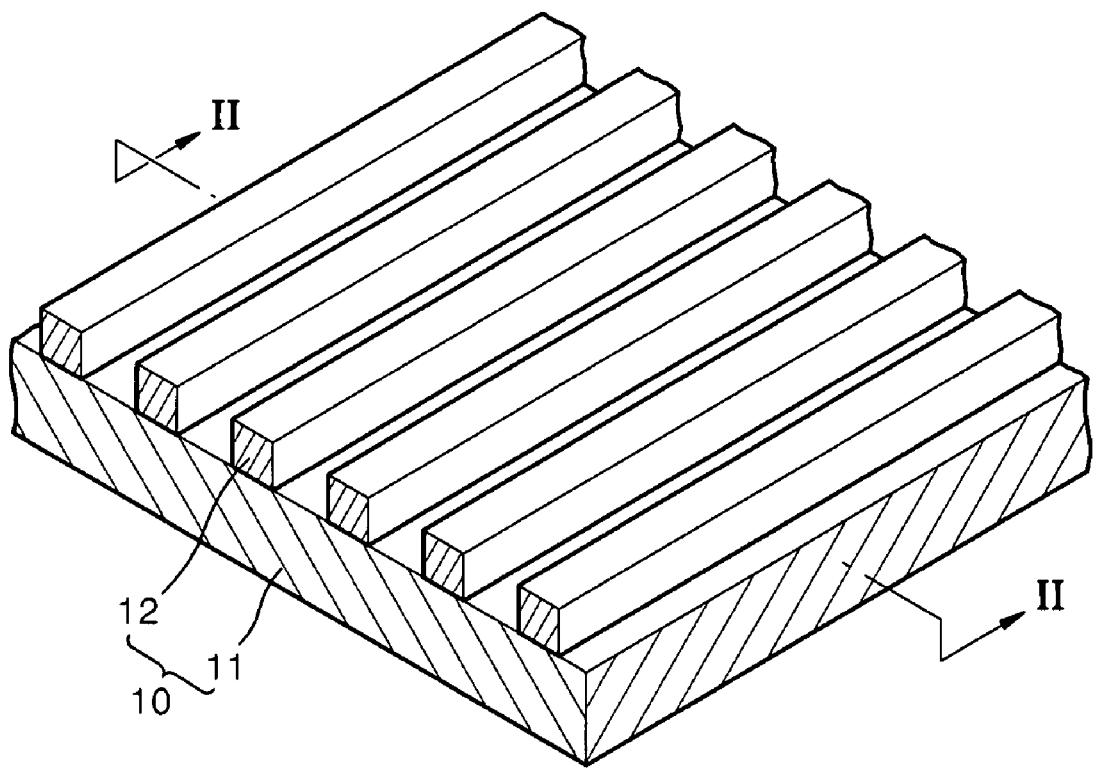
FIG. 1 is a perspective view of a polarizer according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Also, in the drawings, the thicknesses of certain layers and regions are exaggerated for clarity, and like reference numerals refer to like elements. Moreover, in the context of the present application, when an element is referred to as being "on" another element, it can be directly on the another element or be indirectly on the another element with one or more intervening elements and/or suitable gaps interposed therebetween.

Figure 2:
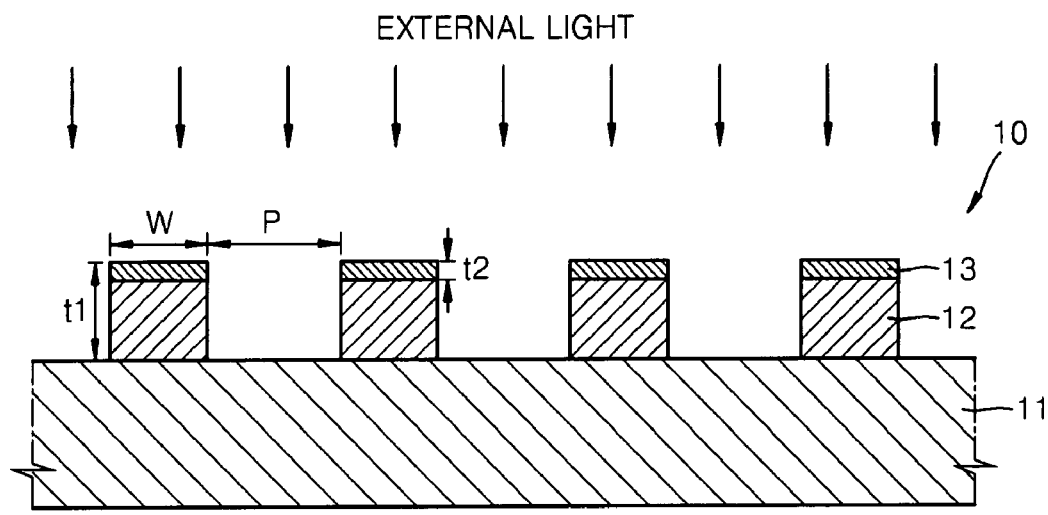
FIG. 2 is a sectional view taken along line II-II in FIG. 1 according to an embodiment of the present invention.

FIG. 1 is a perspective view of a polarizer 10 according to an embodiment of the present invention. FIG. 2 is a sectional view taken along line II-II in FIG. 1 according to an embodiment of the present invention.

Referring to FIGS. 1 and 2, the polarizer 10 includes a base 11 and a plurality of grids 12. The base 11 may be formed of a transparent material to allow light generated in a display device, in which the polarizer 10 is disposed, to be transmitted through the base 11. In one embodiment, the base 11 is formed of glass and/or flexible plastic. In order to form the base 11 as a film, the base 11 may be formed of a material containing plastic.

The grids 12 are formed on the base 11. The grids 12 may be formed to have a stripe pattern such that the grids 12 are formed parallel to each other and separated from one another so as to polarize light having a certain polarity in a electromagnetic wave. In order to be used for polarizing visible light, each of the grids 12 may have a width w ranging from 100 to 500 nm and a thickness t1 ranging from 300 to 500 nm. The grids 12 are separated from each other by a constant interval P, which is a factor affecting the performance of the polarizer 10. When the interval P between the grids 12 is greater than the wavelength of incident light, the polarizer 10 mainly (or substantially) functions as a diffraction grid rather than a polarizer. However, when the interval P between the grids 12 is less than the wavelength of incident light, the grids 12 mainly (or substantially) function as a polarizer.

An optical constant k is related with the absorption of light, and a larger optical constant k improves characteristics of a polarizer in absorbing light vibrating in a specific direction. In general, metal has a relatively large k, and thus is widely used in conventional grids. However, metal has a high surface reflectivity and has a limit to improving the contrast of a display device when used to form grids of a polarizer, due to the reflection of external light from the surface of the grids.

Thus, according to an embodiment of the present invention, the grids 12 are formed of graphite. Graphite has a lower reflectivity than metal and can reduce the reflection of external light when used to form the grids 12. Although graphite has excellent reflection characteristics, its optical constant k is less than 1, which is about one-tenth of the optical constant k of metal, and thus graphite may not sufficiently function as a polarizer alone. Thus, according to an embodiment of the present invention, the grids 12 are formed of metal-containing graphite.

In an embodiment of the present invention, the grids 12 are formed of metal-containing graphite, wherein the graphite is doped with from 1 to 10% by weight of metal. When graphite is doped with from 1 to 10% by weight of metal, the graphite has an optical constant k ranging from 5 to 6, which is similar to the optical constant k of metal. In other words, the grids 12 formed of metal-containing graphite according to an embodiment of the present invention can reduce the reflection of light as compared to conventional grids formed of only metal. As a result, grids that can improve contrast and have an excellent polarizing characteristic and substantially constant optical constant can be formed. Metals that can be used for the grids 12 include silver, gold, aluminum, tungsten, and chromium.

In one embodiment, when the graphite used to form the grids 12 contains less than 1% of metal by weight, the effect of adding the metal is negligible, and the optical constant k of the graphite is considerably less as compared to metal. In another embodiment, when the graphite used to form the grids 12 contains greater than 10% of metal by weight, the reflectivity of the grids 12 is too high, causing a large amount of light to be reflected, thereby reducing the contrast. Thus, the graphite used to form the grids 12 in an embodiment of the present invention contains from 1 to 10% by weight of metal. In order to incorporate from 1 to 10% by weight of metal into graphite, various suitable processes may be used. For example, an ion implantation process, or a co-deposition process that is more convenient to perform than ion implantation may be used to incorporate the metal into the graphite. When using the co-deposition process, vacuum deposition may be performed using graphite and metal as separate vaporization sources. For a structure containing less metal than graphite, a smaller amount of the metal vaporization source than the graphite vaporization source is deposited. The amounts of the vaporization sources may be determined according to the amount of metal to be contained.

In an embodiment of the present invention, a low-reflection layer 13 may be formed on a surface of the grids 12 that faces a direction in which external light is incident. Referring to FIG. 2, external light is incident on a surface of the grids 12 that faces away from the base 11. Accordingly, referring to FIG. 2, according to an embodiment of the present invention, the polarizer 10 includes the low-reflection layer 13 on the surface of each of the grids 12 facing away from the base 11. The low-reflection layer 13 may be formed by injecting hydrogen and/or nitrogen while graphite and metal are co-deposited to form the grids 12. The low-reflection layer 13 having a thickness that may be predetermined is formed on the surfaces of the grids 12 using nitrogen and/or hydrogen. The low-reflection layer 13 having the structure as illustrated in FIG. 2 may be formed by co-depositing graphite and metal and injecting hydrogen and/or nitrogen during the second part of the co-deposition process. The time at which hydrogen and/or nitrogen is injected is related to the thickness of the low-reflection layer 13. When nitrogen and/or hydrogen is injected during the co-deposition of graphite and metal, the particles of the hydrogen and/or nitrogen affect the planar structure of the graphite so that the low-reflection layer 13 has a different film characteristic from the grids 12.

The low-reflection layer 13 may have a thickness t2 ranging from 50 to 1000 Å. In one embodiment, when the thickness t2 of the low-reflection layer 13 is less than 50 Å, the effect of the low-reflection layer 13 is negligible. In another embodiment, when the thickness t2 of the low-reflection layer 13 is greater than 1000 Å, the amount of graphite in the polarizer 10 decreases so that the intrinsic black color of graphic fades. Accordingly, the effect of the graphite component for reducing (or preventing) reflection decreases. In order to control the thickness t2 of the low-reflection layer 13, the time at which the hydrogen and/or nitrogen is injected during the co-deposition of graphite and metal can be controlled.

Figure 3:
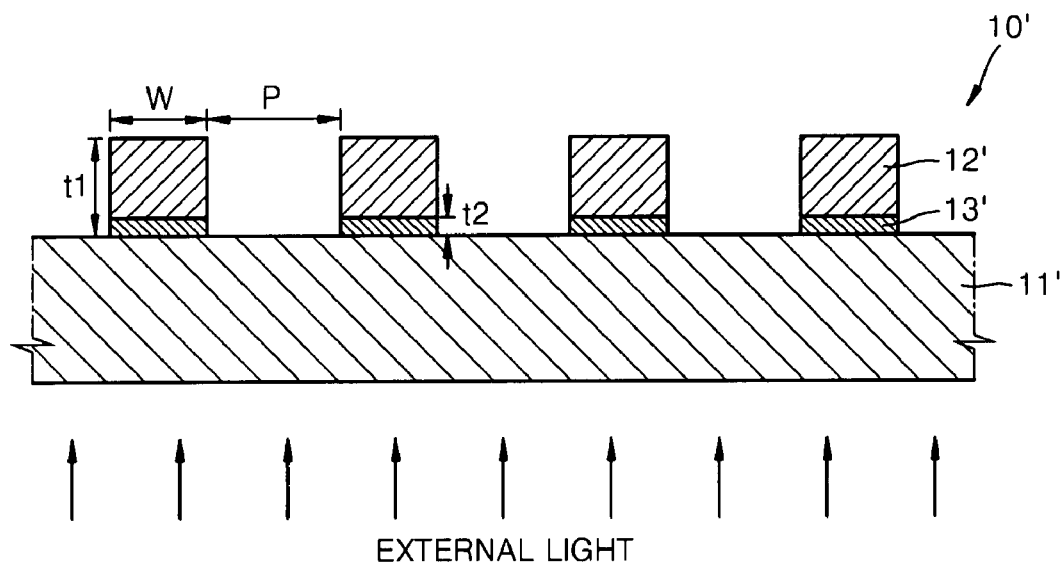
FIG. 3 is a sectional view of a polarizer according to another embodiment of the present invention.

FIG. 3 is the sectional view of a polarizer 10' according to another embodiment of the present invention. Referring to FIG. 3, the polarizer 10' includes a low-reflection layer 13', and external light is incident on a bottom surface of a base 11' (that is substantially the same as base 11). Here, the low-reflection layer 13' is disposed between grids 12' (that is substantially the same as grids 12) and the base 11'. This case is substantially the same as the case of the structure in FIG. 2, except that the process of manufacturing the low-reflection layer 13' is different from the lower-reflection layer 13 of FIG. 2. In particular in the embodiment of FIG. 3, while co-deposition is performed on the base 11' using graphite and metal as vaporization sources, nitrogen and/or hydrogen is injected into a deposition apparatus in an earlier period (or part) of the co-deposition process (not a later period (or part)), and the nitrogen and/or hydrogen is co-deposited together with the graphite and metal. Here, the low-reflection layer 13' having a desired thickness can be obtained by controlling the point of time at which the hydrogen and/or nitrogen is injected to be co-deposited with the metal and graphite. Descriptions of the detailed structure and effects of the low-reflection layer 13' of FIG. 3, which are substantially the same as described with reference to FIG. 2, are not repeated here.

A polarizer according to an embodiment of the present invention can be used in flat panel display devices, such as organic light-emitting display devices, etc. However, the present invention will be described only with reference to organic light-emitting display devices for convenience purposes, and the present invention is not thereby limited. An organic light-emitting display device according to an embodiment of the present invention does not require a base (e.g., 11 and/or 11'). A linear polarization layer composed of a plurality of grids can be directly formed on a substrate, a sealing member, etc. The grids of the linear polarization layer to be described later are substantially the same as the grids 12 (and/or 12') of the polarizer 10 (and/or 10') described above, and thus descriptions of the detailed structure and material of the grids 12 (and/or 12') of the linear polarization layer and a method of forming the same are not provided again. In addition, a low-reflection layer that is substantially the same as the low-reflection layer 13 (and/or 13') may be also formed, and a detailed description of the low-reflection layer is not repeated here.

Figure 4:
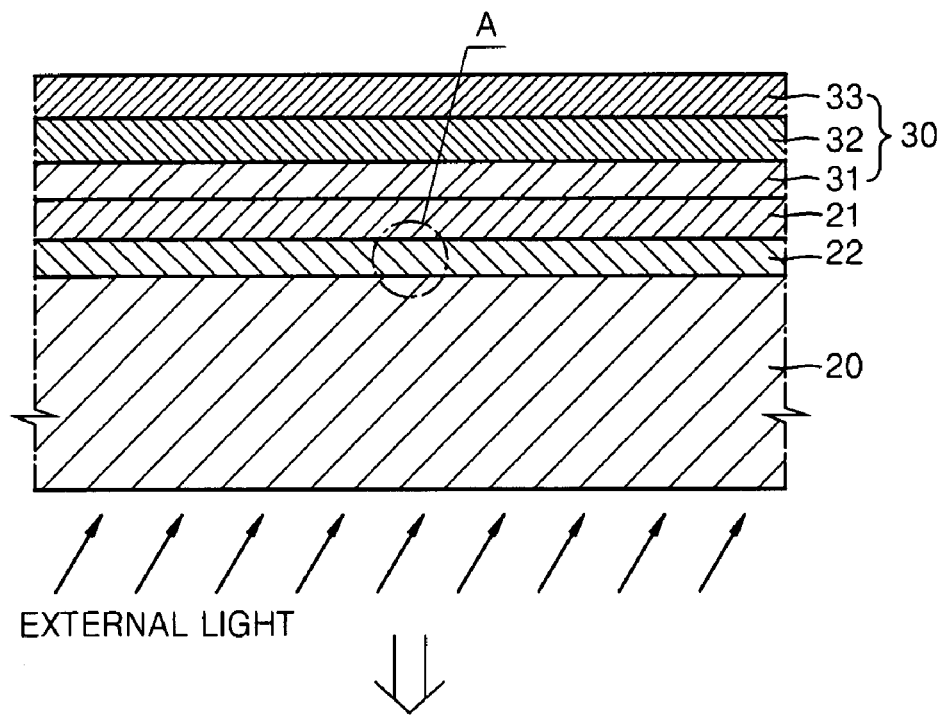
FIGS. 4, 5, 6, 7, 8, and 9 are sectional views of bottom emission type organic light emitting display devices according to embodiments of the present invention, and enlarged sectional views of linear polarizing plates of the bottom emission type organic light emitting display devices.

FIG. 4 is a schematic sectional view of a bottom emission type organic light-emitting display device according to an embodiment of the present invention. Referring to FIG. 4, the bottom emission type organic light-emitting display device includes a transparent substrate 20, and a linear polarization layer 22, a quarter-wave layer 21, and an organic light-emitting device 30, which are sequentially formed on the substrate 20, and a sealing member.

The substrate 20 may be formed of a transparent glass material containing $SiO_2$ as a main component. Although not illustrated, a buffer layer may be further formed on an upper surface of the transparent substrate 20 so as to improve the flatness of the substrate 20 and to block infiltration of impurity ions. The buffer layer may be formed of $SiO_2$, $SiN_x$, etc. However, the material used to form the substrate 20 is not thereby limited. For example, the substrate 20 may be formed of a transparent plastic material.

Figure 5:
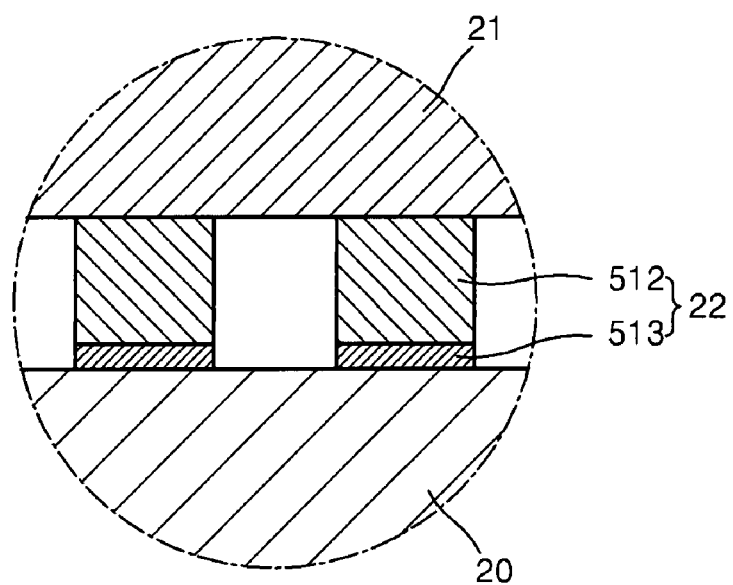

The linear polarization layer 22 is formed on an upper surface of the substrate 20. FIG. 5 is an enlarged view of a portion A in FIG. 4 illustrating a detailed structure of the linear polarization layer 22, according to an embodiment of the present invention. Referring to FIG. 5, the linear polarization layer 22 includes a plurality of grids 512. The grids 512 are formed by depositing graphite with from 1 to 10% by weight of metal. A low-reflection layer 513 is disposed between the grids 512 and the substrate 20. A method of forming the grids 512 and the low-reflection layer 513 has been described above with reference to FIGS. 1 through 3 (e.g., with reference to the grids 12 and/or 12' and the low-reflection layer 13 and/or 13'), and thus a detailed description thereof is not repeated here.

The quarter-wave layer 21 is formed on the linear polarization layer 22. The quarter-wave layer 21 may be formed by depositing an inorganic material using slant deposition. Slant deposition involves forming fine columns to extend across the surface of the quarter-wave layer 21 in a slanted direction. These columns define a crystal growing direction. When depositing an inorganic material, the inorganic material grows in a cylindrical shape. Thus, when performing slant deposition, the cylindrically-shaped inorganic material slants at an angle that may be predetermined with respect to a horizontal plane. Accordingly, the quarter-wave layer 21 has a birefringence characteristic. The quarter-wave layer 21 may be formed of various inorganic materials such as $TiO_2$, $TaO_x$, etc. The quarter-wave layer 21 may be formed of CaO and/or BaO to have a water absorption function.

The organic light-emitting device 30 is formed on the quarter-wave layer 21. The linear polarization layer 22 is arranged to be closer to an external light incidence direction than the quarter-wave layer 21. Another light-transmitting member may be disposed between the linear polarization layer 22 and the quarter-wave layer 21.

The organic light-emitting device 30 includes a first electrode 31, a second electrode 33, which are opposed to each other, and an organic emission layer 32 disposed therebetween. The first electrode 31 may be formed of a transparent conductive material, for example, ITO, IZO, $In_2O_3$, ZnO, or the like. The first electrode 31 may be formed in a pattern that may be predetermined using photolithography. The first electrode 31 may be formed in a pattern of stripes spaced a certain interval apart that may be predetermined for a passive matrix (PM) display or may be a pattern corresponding to pixels for an active matrix (AM) display. The second electrode 33 is disposed above the first electrode 31. The second electrode 33 may be a reflective electrode. The second electrode 33 may be formed of aluminum, silver, calcium, etc. and can function as a cathode by being connected to an external terminal. For a PM display, the second electrode 33 may be formed in a stripe shape pattern perpendicular to the pattern of the first electrode 31. For an AM display, the second electrode 33 may be formed over an entire active region in which images appear. The polarity of the first electrode 31 may be opposite to that of the second electrode 33.

The organic emission layer 32 disposed between the first electrode 31 and the second electrode 33 emits light when electrically driven. The organic emission layer 32 may be formed of a small-molecular weight or polymer organic material. When the organic emission layer 32 is formed of a small-molecular weight organic material, a hole transporting layer, a hole injecting layer, etc., are stacked on the organic emission layer 32 in a direction toward the first electrode 31. Other layers may be deposited if required. Examples of small-molecule weight organic materials that can be used to form the organic emission layer 32 include copper phthalocyanine (CuPc), N,N'-di(naphthalene-1-yl)-N,N'-diphenyl-benzidine (NPB), tris-8-hydroxyquinoline aluminum (Alq3), etc.

When the organic emission layer 32 is formed of a polymer organic material, only a hole transporting layer may be formed on the organic emission layer 32 in the direction toward the first electrode 31. The hole transporting layer may be formed on the first electrode 31 using a polymer. The hole transporting layer may be formed of a polymer such as poly-(2,4)-ethylene-dihydroxy thiophene (PEDOT), polyaniline (PANI), or the like, and may be formed on organic emission layer 32 using an ink jet printing method, a spin coating, or the like. The organic emission layer 32 may be formed of PPV, soluble PPV's, cyano-PPV, polyfluorene, or the like, and may be formed in a color pattern using any suitable method, such as inkjet printing, spin coating, a heat transfer method using laser, or the like.

In the embodiment of the present invention illustrated in FIG. 4, light generated in the organic light-emitting device 30 is emitted toward the substrate 20, and images can be viewed through the substrate 20 from below the substrate 20. In such a bottom emission type structure, external light, such as sunlight, enters the display through the substrate 20 and lowers the contrast. However, according to the current embodiment of the present invention, the linear polarization layer 22 and the quarter-wave layer 21 form a circular polarization layer, thereby minimizing the reflection of external light. As external light is incident on the substrate 20, passes through the substrate 20 and reaches the linear polarization layer 22, a component of the external light that is parallel to an absorption axis of the linear polarization layer 22 is absorbed, and a component of the external light that is parallel to a transmission axis of the linear polarization layer 22 is transmitted. The component parallel to the transmission axis is converted into circular polarized light that rotates in a first direction while passing through the quarter-wave layer 21. The circular polarized light is reflected by the second electrode 33 of the organic light-emitting device 30. The circular polarized light that rotates in the first direction is converted into circular polarized light that rotates in a second direction while being reflected by the second electrode 33 and is converted into linear polarized light perpendicular to the transmission axis of the linear polarization layer 22 while passing through the quarter-wave layer 21. The linear polarized light is absorbed by the absorption axis of the linear polarization layer 22 and cannot be externally emitted through the substrate 20. Thus, the reflection of external light is minimized, and the contrast is further improved.

The grids 512 of the linear polarization layer 22 are formed of metal-containing graphite, wherein the graphite is doped with from 1 to 10% by weight of metal. As a result, the reflection of external light at the grids 512 is reduced. When external light incident through the substrate 20 reaches the linear polarization layer 22, the reflection of the external light at the grids 512, which contain graphite as a main component, is reduced. Consequently, the contrast is improved.

In addition, the low-reflection layer 513 is formed on a surface of each of the grids 512 that faces the direction in which external light is incident, so as to further reduce the reflection of the external light and further improve the contrast. In addition, in the structure in which the linear polarization layer 22 and the quarter-wave layer 21 are formed directly on the substrate 20, no adhesive layer is required. Thus, with such a structure, an organic light-emitting display device with a smaller thickness can be implemented. In addition, the brightness of images generated by the organic emission layer 32 increases because there is no adhesive layer through which the light has to pass.

The linear polarization layer 22 and the quarter-wave layer 21 may be formed using various suitable methods. The structures of the linear polarization layer 22 and the quarter-wave layer 21 can be suitably varied for a top emission type display as well as the bottom emission type organic light-emitting display device described above, in consideration of the direction in which external light is incident.

Figure 6:
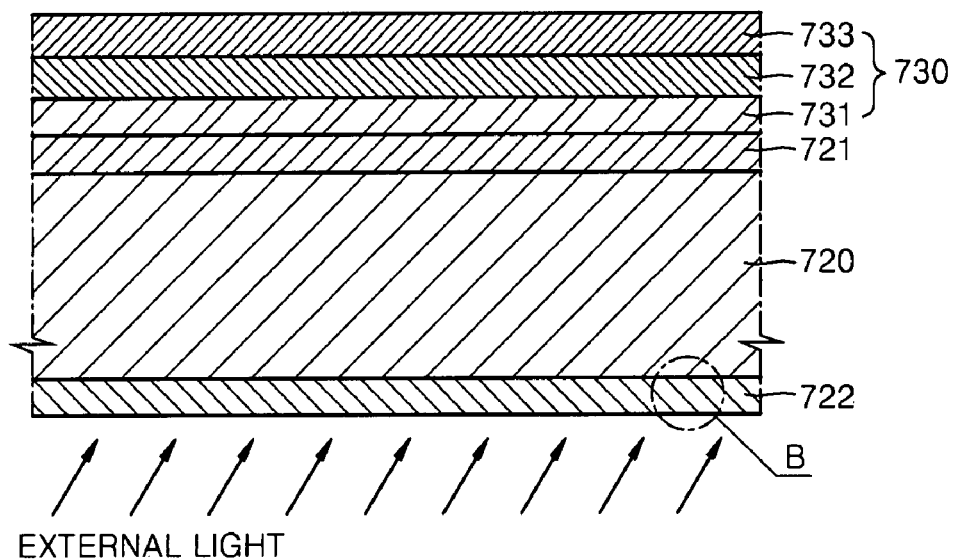

FIG. 6 is a sectional view of a bottom emission type organic light-emitting display device according to another embodiment of the present invention. A linear polarization layer 722 is formed on a rear surface of a substrate 720, that is, on a surface of the substrate 720 on which external light is incident, and a quarter-wave layer 721 is formed on a surface of the substrate 720 opposite to the rear surface of the substrate 720 on which the linear polarization layer 722 is formed. An organic light-emitting device 730 is formed on the quarter-wave layer 721. The organic light-emitting device 730 includes a first electrode 731, a second electrode 733, which are opposed to each other, and an organic emission layer 732 disposed therebetween.

Figure 7:
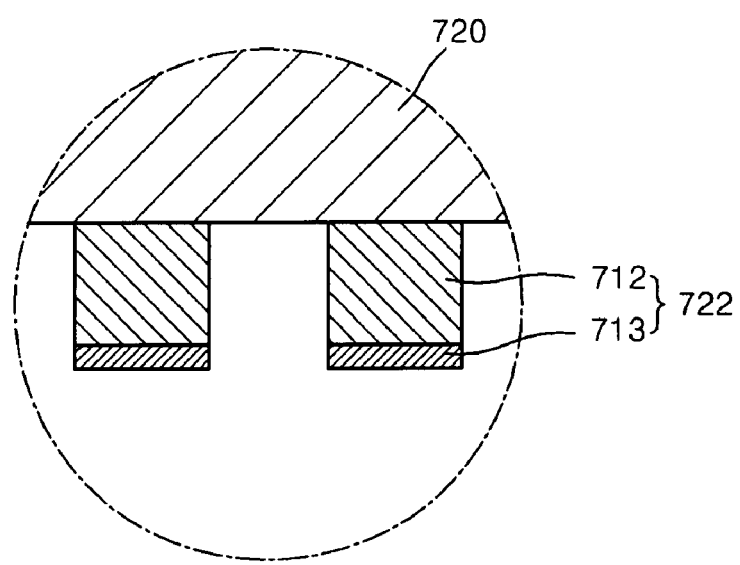

FIG. 7 is an enlarged view of a portion B in FIG. 6 illustrating a detailed structure of the linear polarization layer 722, according to an embodiment of the present invention. Referring to FIG. 7, the linear polarization layer 722 includes a plurality of grids 712. The grids 712 are formed of metal-containing graphite, wherein the graphite is doped with from 1 to 10% by weight of metal. A low-reflection layer 713 may be further formed on a surface of each of the grids 712 facing away from the substrate 720. Descriptions of each of the above elements are substantially the same as those provided for the previous embodiment, and thus are not repeated here. In the current embodiment, external light incident through the substrate 720 is converted into linear polarized light parallel to the transmission axis of the linear polarization layer 722 while passing through the linear polarization layer 722, and is converted into circular polarized light that rotates in a first direction, while passing through the quarter-wave layer 721 after passing through the substrate 720. The circular polarized light that rotates in the first direction becomes circular polarized light that rotates in a second direction, after being reflected by the second electrode 733. The circular polarized light that rotates in the second direction is converted into linear polarized light perpendicular to the transmission axis of the linear polarization layer 722 while passing back through the quarter-wave layer 721. The linear polarized light cannot pass through the linear polarization layer 722 so that the reflected external light cannot be seen from below the bottom emission type organic light-emitting display device according to the current embodiment of the present invention. Due to a reduction in the amount of external light, the contrast is improved. Furthermore, as described above, the linear polarization layer 722 includes the plurality of grids 712 which are formed of metal-containing graphite, wherein the graphite is doped with from 1 to 10% by weight of metal, and which reduce the reflection of external light, thereby further improving the contrast. The low-reflection layer 713 is formed on a surface of each of the grids 712 of the linear polarization layer 722 that faces the direction in which external light is incident, thereby further reducing the reflection of the external light.

Figure 8:
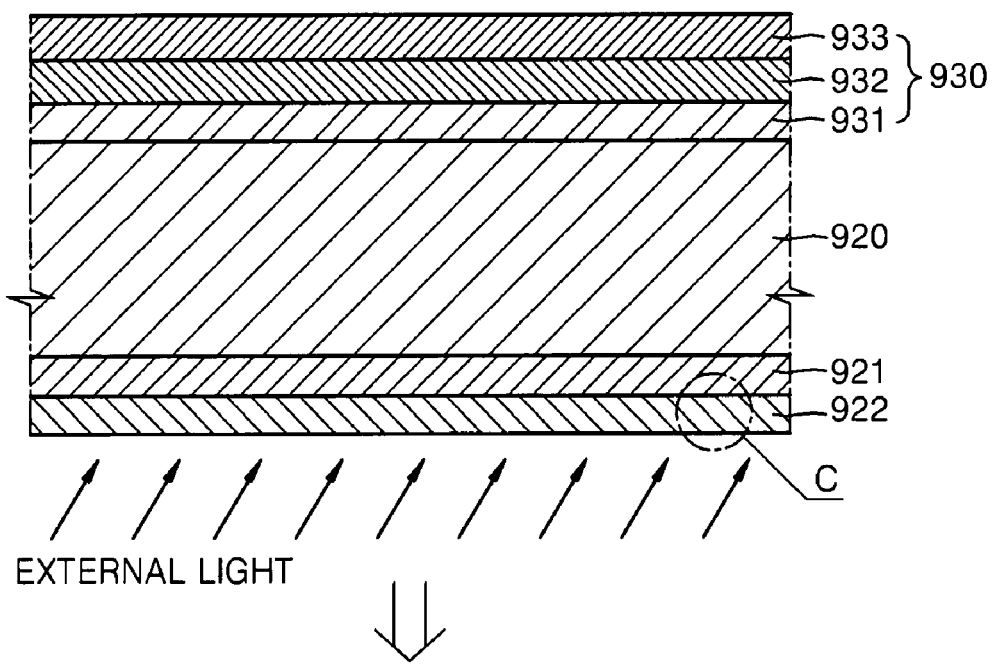

FIG. 8 is a sectional view of a bottom emission type organic light-emitting display device according to another embodiment of the present invention. Here, a quarter-wave layer 921 and a linear polarization layer 922 are sequentially formed on a rear surface of a substrate 920, that is, on a surface of the substrate 920 on which external light is incident, and an organic light-emitting device 930 is formed on a surface of the substrate 920 opposite to the rear surface of the substrate 920. The organic light-emitting device 930 includes a first electrode 931, a second electrode 933, which are opposed to each other, and an organic emission layer 932 disposed therebetween. Descriptions of each of the above elements are the same as those provided for the previous embodiments, and thus are not repeated here.

Figure 9:
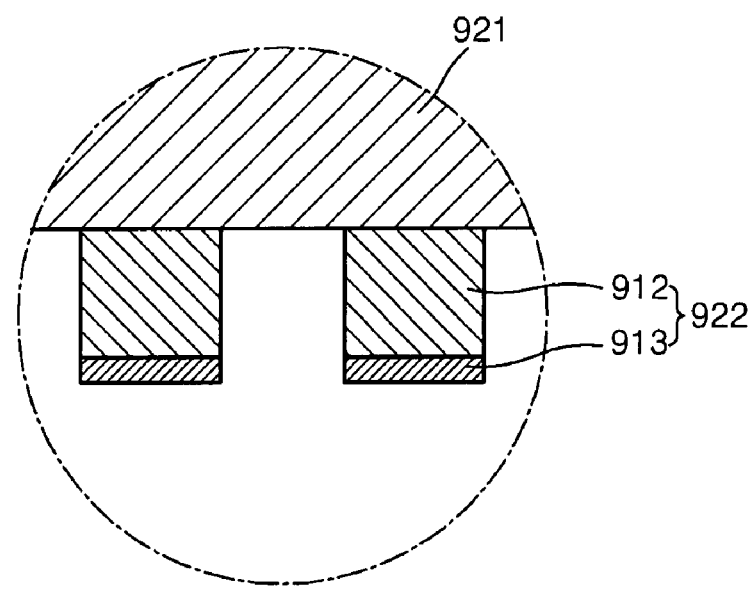

FIG. 9 is an enlarged view of portion C in FIG. 8 illustrating a detailed structure of the linear polarization layer 922, according to an embodiment of the present invention. Referring to FIG. 9, the linear polarization layer 922 includes a plurality of grids 912. The grids 912 are formed on a lower surface of the quarter-wave layer 921. The grids 912 are formed by doping graphite with from 1 to 10% by weight. The low-reflection layer 913 may be formed on a surface of each of the grids 912 facing away from the quarter-wave layer 921. As a result, as described above, the reflection of external light is reduced, and the contrast increases.

Although the present invention has been described above with reference to bottom emission type organic light-emitting display devices in which images are viewed from a rear of the substrate 920, the present invention is not limited thereto. In other words, the present invention can be applied to top emission type display devices in which images generated by the emission layer are viewed from a position in front of the substrate 920, not from the rear of the substrate 920.

Figure 10:
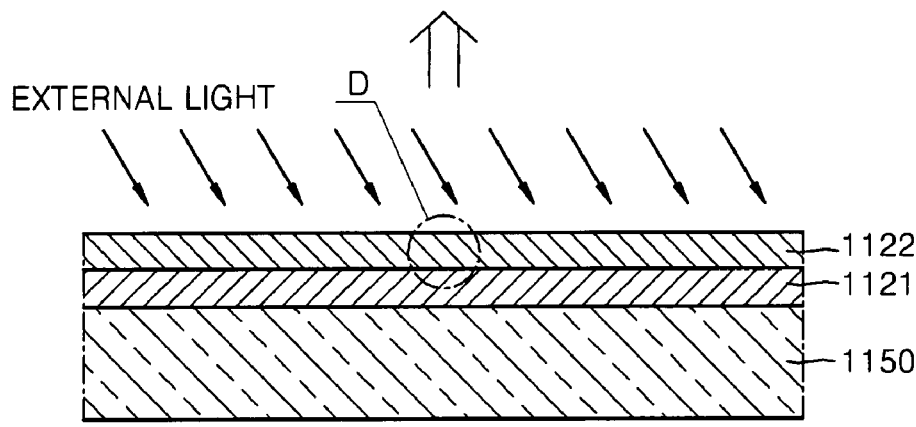
FIGS. 10, 11, 12, 13, 14, 15, 16, 17, 18, 19, and 20 are sectional views of top emission type organic light emitting display devices according to embodiments of the present invention, and enlarged sectional views of linear polarizing plates of the top emission type organic light emitting display devices.

FIG. 10 is a sectional view of a top emission type organic light-emitting display device according to an embodiment of the present invention. The top emission type organic light-emitting display device in FIG. 10 includes a substrate 1120, a reflection layer 1134 and an organic light-emitting device 1130, which are sequentially formed on the substrate 1120, and a sealing member 1150 on which a quarter-wave layer 1121 and a linear polarization layer 1122 are formed. The organic light-emitting device 1130 includes a first electrode 1131, a second electrode 1133, which are opposed to each other, and an organic emission layer 1132 disposed therebetween.

The substrate 1120 may be formed of transparent glass as described above, but is not limited thereto. For example, the substrate 1120 may be formed of plastics for flexibility or metal. An insulating layer may be further formed on a surface of the substrate 1120 when the substrate 1120 is formed of metal.

The reflection layer 1134 on a surface of the substrate 1120 may be formed of Ag, Mg, Al, Pt, Pd, Au, Ni, Nd, Ir, Cr, combinations thereof, or the like. A first electrode 31 on the reflection layer 34 may be formed of a material having a high-work function, such as ITO, IZO, ZnO, $In_2O_3$, or the like. The first electrode 31 functions as an anode. However, the present invention is not limited thereto and the first electrode 1131 may also function as a cathode. When the first electrode 1131 functions as a cathode, the first electrode 1131 may be formed of Ag, Mg, Al, Pt, Pd, Au, Ni, Nd, Ir, Cr, or combinations thereof so as to function also as the reflection layer 1134. Hereinafter, the function of the first electrode 1131 as an anode will be described as an example in more detail.

The second electrode 1133 is formed of a transmissive electrode. In this case, the second electrode 1133 is formed as a thin, semi-transmissive layer using a metal having a low-work function, such as Li, Ca, LiF/Al, Al, Mg, Ag, or the like. A transparent conductor layer may be formed on the semi-transmissive metal layer using ITO, IZO, ZnO, $In_2O_3$, or the like, so as to overcome the high resistance of the thin semi-transmissive metal layer. An organic emission layer 1132 is disposed between the first electrode 1131 and the second electrode 1133 and is the same (or substantially the same) as the organic emission layer 1132 described in the previous embodiments.

The sealing member 1150 for the organic light-emitting device 1130 is formed on the organic light-emitting device 1130. The sealing member 1150 is for protecting the organic light-emitting device 1130 from external moisture, oxygen, etc. and is formed of a transparent material. To this end, the sealing member 1150 may be formed of a glass substrate, a plastic substrate, or a structure in which a plurality of organic and inorganic material layers overlap.

Figure 11:
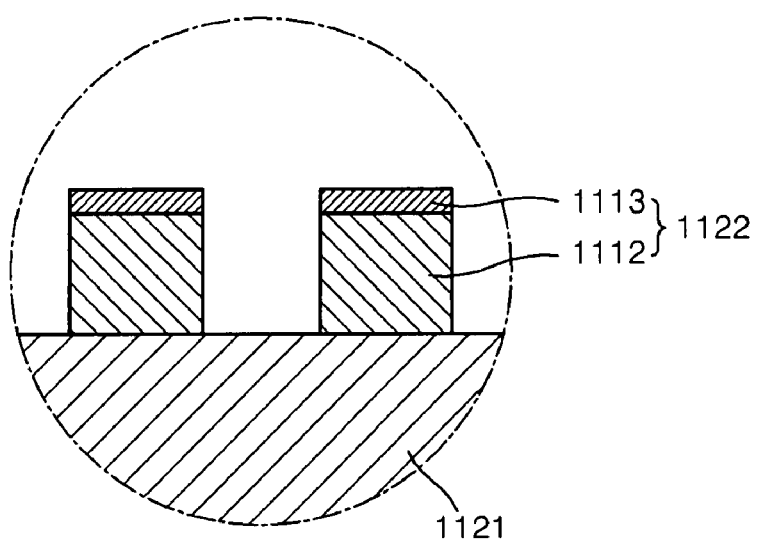

The quarter-wave layer 1121 and the linear polarization layer 1122 are sequentially formed on an upper surface of the sealing member 1150, that is, on a surface of the sealing member 1150 on which external light is incident, and facing away from the organic-light emitting device 1130. FIG. 11 is an enlarged view of a portion D in FIG. 10 illustrating a detailed structure of the linear polarization layer 1122, according to an embodiment of the present invention. Referring to FIG. 11, a plurality of grids 1112 are formed on the quarter-wave layer 1121. The grids 1112 are formed of metal-containing graphite, wherein the graphite is doped with from 1 to 10% by weight of metal. A low-reflection layer 1113 may be formed on a surface of each of the grids 1112 facing away from the quarter-wave layer 1121. In the current embodiment, external light incident from above the top emission type organic light-emitting display device, at which images are viewed, sequentially passes through the linear polarization layer 1122 and the quarter-wave layer 1121 and is reflected by a surface of the reflection layer 1134. However, the external light reflected by the reflection layer 1134 cannot pass through the linear polarization layer 1122. The principle involved therein is the same (or substantially the same) as described above.

In addition, the grids 1112 are formed of metal-containing graphite, wherein the graphite is doped with from 1 to 10% by weight of metal, so that the reflection of external light incident from above the top emission type organic light-emitting display device at the grids 1112 is reduced. As a result, the contrast increases. The linear polarization layer 1122 includes a low-reflection layer 1113 and is formed on a surface of each of the grids 1112 that faces a direction in which external light is incident, thereby further reducing the reflection of the external light.

Figure 12:
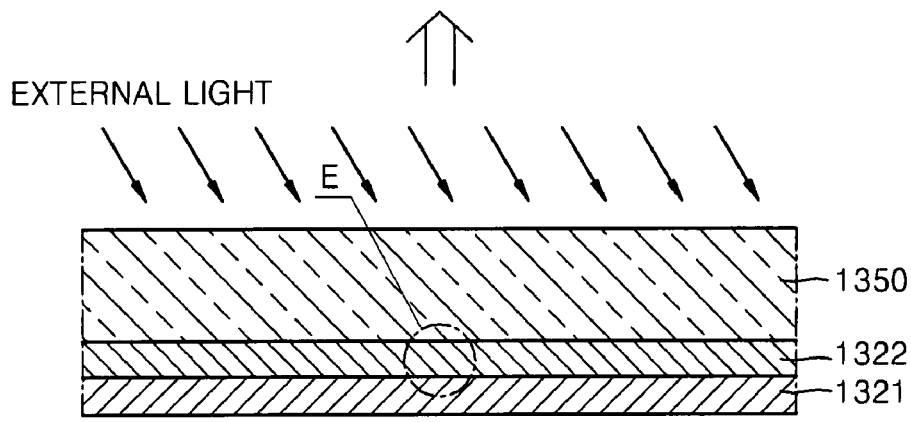
Figure 13:
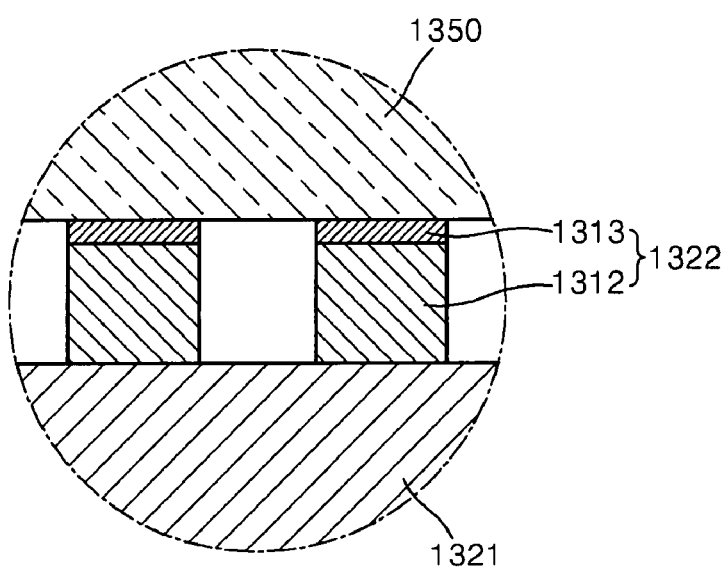

FIG. 12 is a sectional view of a top emission type organic light-emitting display device according to another embodiment of the present invention. Here, a linear polarization layer 1322 and a quarter-wave layer 1321 are sequentially formed on a surface of a sealing member 1350 facing an organic light-emitting device 1330. The organic light-emitting device 1330 includes a first electrode 1331, a second electrode 1333, which are opposed to each other, and an organic emission layer 1332 disposed therebetween. FIG. 13 is an enlarged view of a portion E in FIG. 12 illustrating a detailed structure of the linear polarization layer 1322, according to an embodiment of the present invention. Referring to FIG. 13, a plurality of grids 1312 are formed on a lower surface of the sealing member 1350. The grids 1312 are formed of metal-containing graphite, wherein the graphite is doped with from 1 to 10% by weight of metal. The linear polarization layer 1322 may include a low-reflection layer 1313 disposed between the sealing member 1350 and the grids 1312. Detailed structures and effects of the elements of the present embodiment, which are the same (or substantially the same) as those of previous embodiments, are not repeated here.

Figure 14:
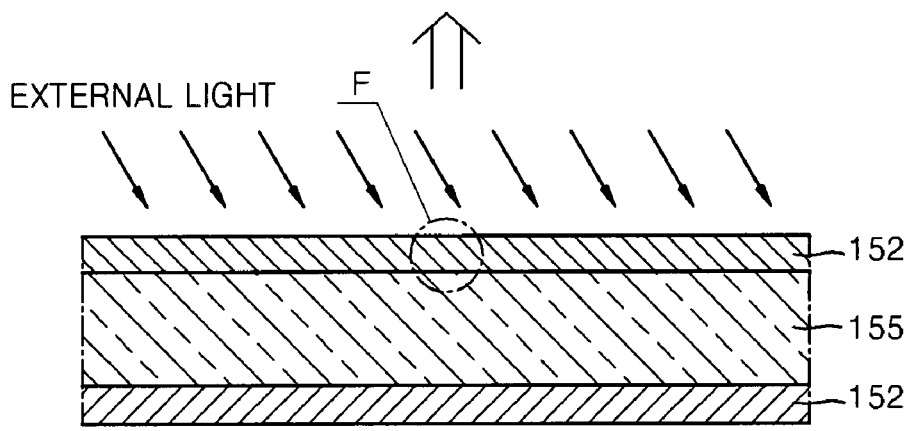
Figure 15:
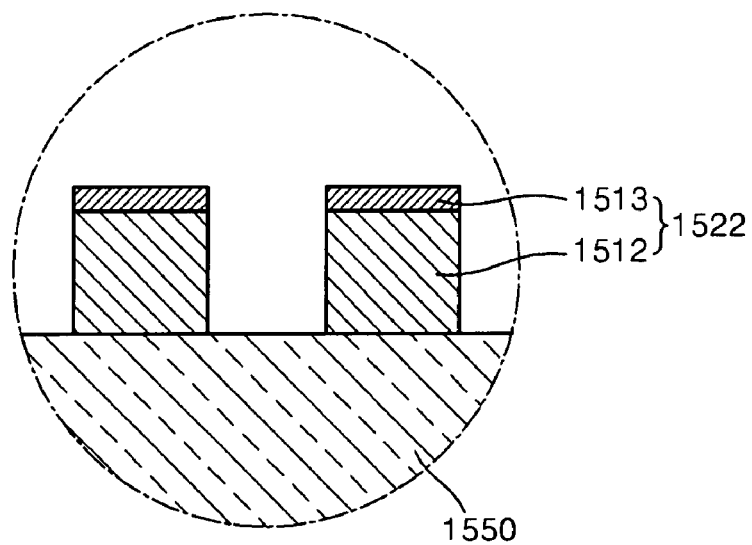

FIG. 14 is a sectional view of a top emission type organic light-emitting display device according to another embodiment of the present invention. Here, a linear polarization layer 1522 is formed on an upper surface of a sealing member 1550, that is, on a surface of the sealing member 1550 on which external light is incident, and a quarter-wave layer 1521 is formed on a surface of the sealing member 1550 facing an organic light-emitting device 1530. The organic light-emitting device 1530 includes a first electrode 1531, a second electrode 1533, which are opposed to each other, and an organic emission layer 1532 disposed therebetween. FIG. 15 is an enlarged view of a portion F in FIG. 14 illustrating a detailed structure of the linear polarization layer 1522, according to an embodiment of the present invention. Referring to FIG. 15, a plurality of grids 1512 are formed on an upper surface of the sealing member 1550. The grids 1512 are formed of metal-containing graphite, wherein the graphite is doped with from 1 to 10% by weight of metal. The linear polarization layer 1522 may include a low-reflection layer 1513 formed on a surface of each of the grids 1512 facing away from the sealing member 1550. Detailed structures and effects of the elements of the present embodiment, which are the same (or substantially the same) as those of previous embodiments, are not repeated here.

Figure 16:
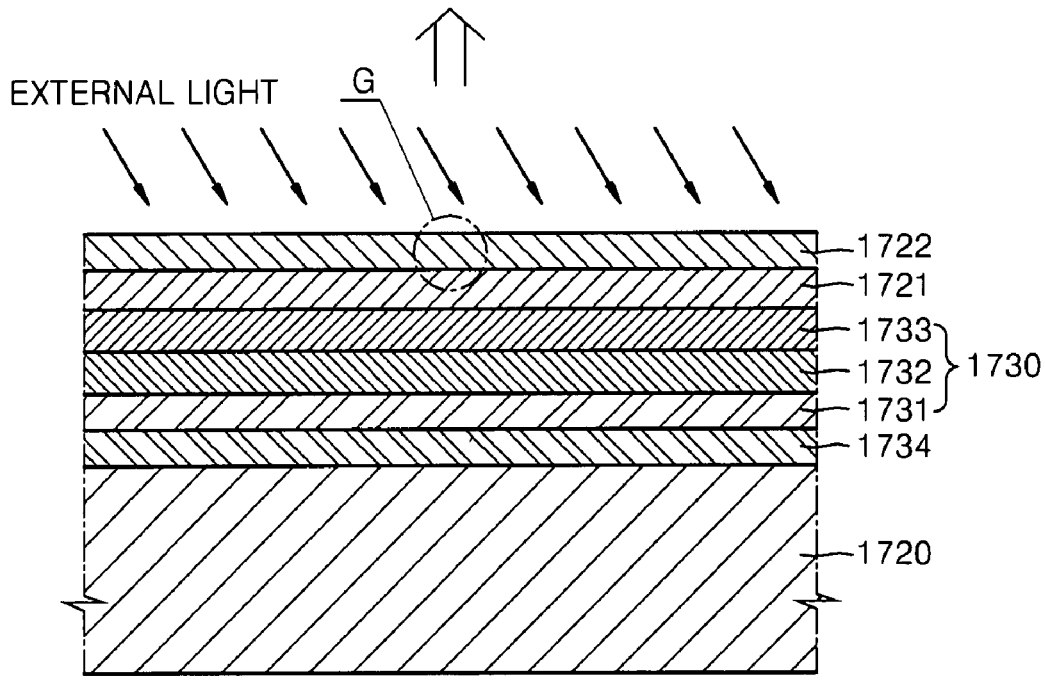
Figure 17:
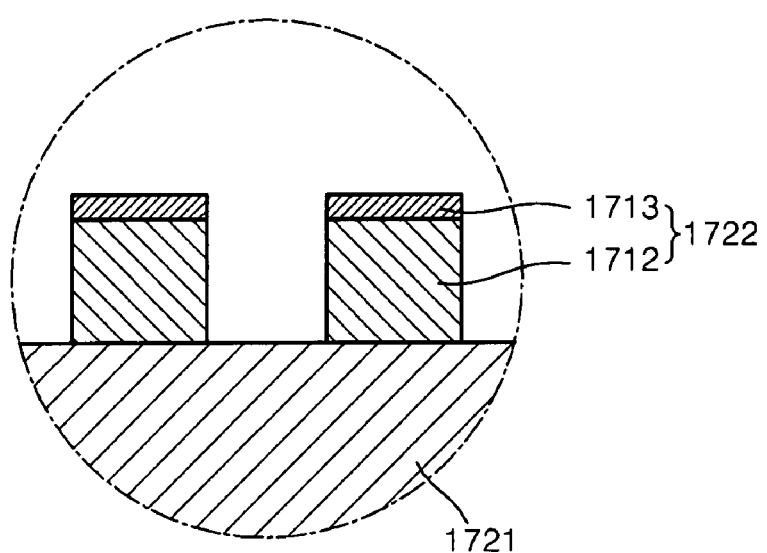

FIG. 16 is a sectional view of a top emission type organic light-emitting display device according to another embodiment of the present invention. Here, a reflection layer 1734 is formed on a substrate 1720, an organic light-emitting device 1730 is formed on the reflection layer 1734, a quarter-wave layer 1721 is formed on the organic light-emitting device 1730, and a linear polarization layer 1722 is formed on the quarter-wave layer 1721. The organic light-emitting device 1730 includes a first electrode 1731, a second electrode 1733, which are opposed to each other, and an organic emission layer 1732 disposed therebetween. FIG. 17 is an enlarged view of a portion G in FIG. 16 illustrating a detailed structure of the linear polarization layer 1722, according to an embodiment of the present invention. Referring to FIG. 17, a plurality of grids 1712 are formed on the quarter-wave layer 1721. The grids 1712 are formed of metal-containing graphite, wherein the graphite is doped with from 1 to 10% by weight of metal. The linear polarization layer 1722 may include a low-reflection layer 1713 formed on a surface of each of the grids 1712 facing away from the quarter-wave layer 1721.

Figure 18:
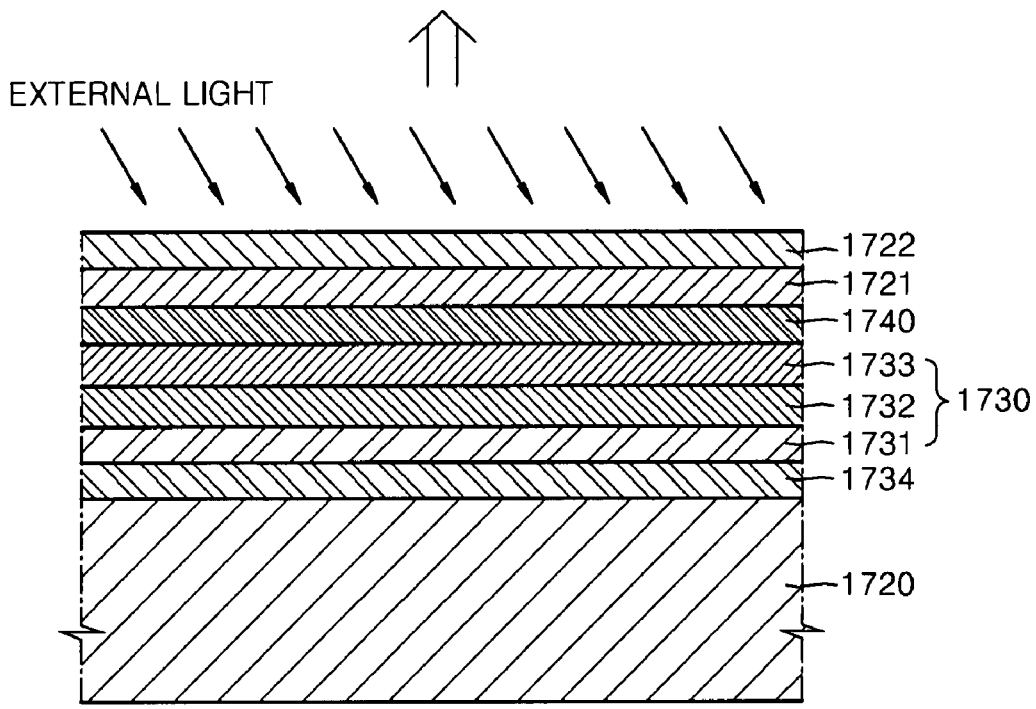
Figure 19:
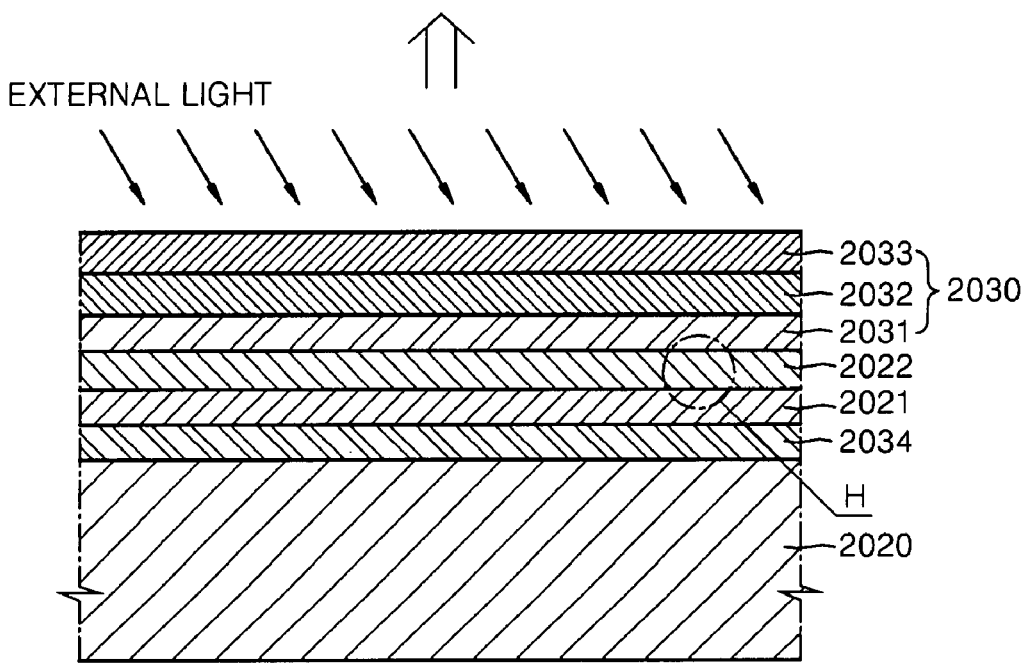
Figure 20:
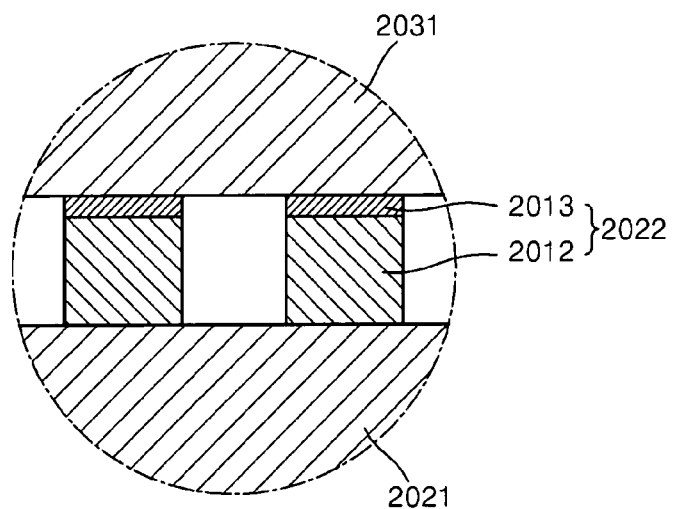

Here, a protective layer may be formed between the second electrode 1733 and the quarter-wave layer 1721. Referring to FIG. 18, in one embodiment, a protective layer 1740 is formed between the second electrode 1733 of the organic light-emitting device 1730 and the quarter-wave layer 1721. The structure of FIG. 18 is the same (or substantially the same) as the structure of FIG. 16, except for the protective layer 1740. Accordingly, only the protective layer 1740 will be described here in more detail. In FIG. 18, the protective layer 1740 is formed in order to prevent damage of the second electrode 1733 (or to protect the second electrode 1733 from damage) during a process of forming the quarter-wave layer 1721. The protective layer 1740 is formed of an inorganic material or an organic material. Examples of the inorganic material include a metal oxide, a metal nitride, a metal carbide, a metal oxynitride, and combinations thereof. Examples of the metal oxide include silicon oxide, aluminum oxide, titanium oxide, indium oxide, tin oxide, indium tin oxide, and combinations thereof. Examples of the metal nitride include aluminum nitride, silicon nitride, and combinations thereof. An example of the metal carbide is silicon carbide. An example of the metal oxynitride is silicon oxynitride. Other examples of the inorganic material include silicon, a ceramic derivative of silicon, a ceramic derivative of metal, diamond-like carbon (DLC), etc. Examples of the organic material include an organic polymer, an organometallic polymer, a hybrid organic/inorganic polymer, an acrylic resin, etc. Detailed structures and effects of the elements of the present embodiment, which are the same (or substantially the same) as those of previous embodiments, are not repeated here FIG. 19 is a sectional view of a top emission type organic light-emitting device according to another embodiment of the present invention. In the current embodiment, a quarter-wave layer 2021 and a linear polarization layer 2022 are formed between a reflection layer 2034 and an organic light-emitting device 2030. The organic light-emitting device 2030 includes a first electrode 2031, a second electrode 2033, which are opposed to each other, and an organic emission layer 2032 disposed therebetween. FIG. 20 is an enlarged view of a portion H in FIG. 19 illustrating a detailed structure of the linear polarization layer 2022, according to an embodiment of the present invention. Referring to FIG. 20, a plurality of grids 2012 are formed on the quarter-wave layer 2021. The grids 2012 are formed of metal-containing graphite, wherein the graphite is doped with from 1 to 10% by weight of metal. The linear polarization layer 2022 may include a low-reflection layer 2013 formed on a surface of each of the grids 2012 facing away from the quarter-wave layer 2021. In other words, the low-reflection layer 2013 may be formed between the first electrode 2031 and the grids 2012. Detailed structures and effects of the elements of the present embodiment, which are the same those of previous embodiments, are not repeated here.

In another embodiment of the present invention, the quarter-wave layer 2021 may be formed on an upper surface of the reflection layer 2034, the organic light-emitting device 2030 may be formed on the quarter-wave layer 2021, and the linear polarization layer 2022 may be formed on the organic light-emitting device 2030.

Figure 21:
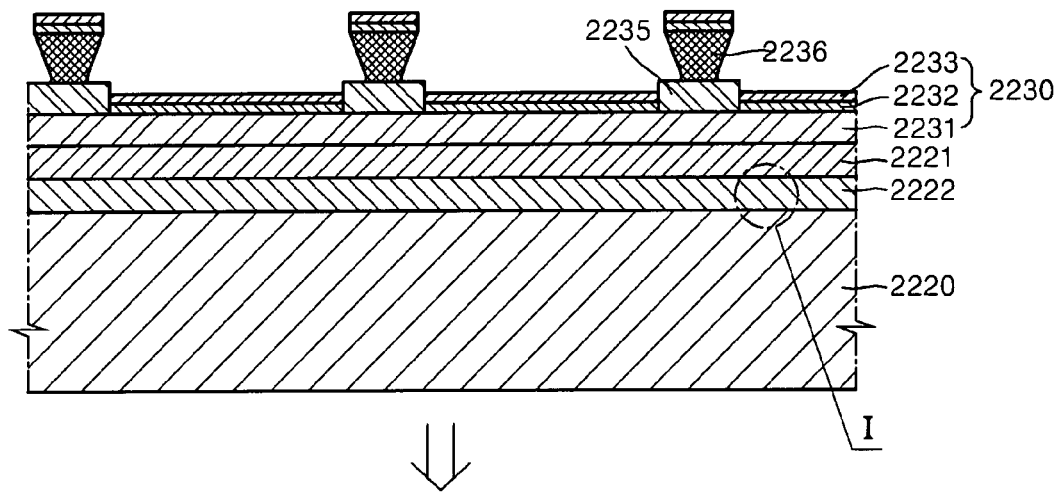
FIGS. 21 and 22 are a sectional view of a passive matrix (PM), bottom emission type organic light emitting display device according to an embodiment of the present invention, and an enlarged sectional view of a linear polarizing plate of the passive matrix bottom emission type organic light emitting display device of FIG. 21, respectively.
Figure 22:
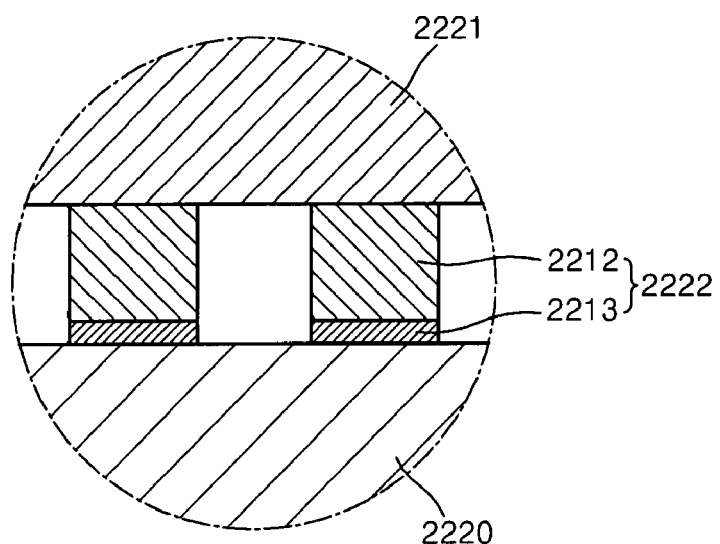

FIG. 21 is a schematic sectional view of a passive matrix (PM), bottom emission type organic light-emitting display device according to an embodiment of the present invention. Referring to FIG. 21, in the passive matrix (PM), bottom emission type organic light-emitting display device according to the current embodiment of the present invention, a linear polarization layer 2222 and a quarter-wave layer 2221 are sequentially formed on an upper surface of a substrate 2220, and an organic light-emitting device 2230 is formed on the quarter-wave layer 2221. The organic light-emitting device 2230 includes a first electrode 2231, a second electrode 2233, which are opposed to each other, and an organic emission layer 2232 disposed therebetween. FIG. 22 is an enlarged view of a portion I in FIG. 21 illustrating a detailed structure of the linear polarization layer 2222, according to an embodiment of the present invention. Referring to FIG. 22, a plurality of grids 2212 are formed on the substrate 2220. The grids 2212 are formed of metal-containing graphite, wherein the graphite is doped with from 1 to 10% by weight of metal. The linear polarization layer 2222 may include a low-reflection layer 2213 formed on a surface of each of the grids 2212 that faces the substrate 2220. In other words, the low-reflection layer 2213 is disposed between the grids 2212 and the substrate 2220.

The first electrode 2231 is formed in a stripe pattern that may be predetermined on the quarter-wave layer 2221. An internal insulating layer 2235 is formed on the first electrode 2231 in a pattern crossing the stripe pattern of the first electrode 2231. A separator 2236 is formed on the internal insulating layer 2235 to be perpendicular to the first electrode 2231 in order to pattern the organic emission layer 2232 and the second electrode 2233. The organic emission layer 2232 and the second electrode 2233 are patterned along the separator 2236 so as to cross the first electrode 2231. A sealing member is disposed on the second electrode 2233 so as to seal the organic light-emitting device 2230 from (or away from) external air, moisture, etc. In some cases, the organic emission layer 2232 and the second electrode 2233 can be patterned without using the separator 2236.

In the embodiment illustrated in FIG. 21, since the linear polarization layer 2222 and the quarter-wave layer 2221 are sequentially stacked on the substrate 2220 in a manner substantially the same as in the other embodiments described above, reflection of external light incident on the substrate 2220, i.e., from below the passive matrix (PM), bottom emission type organic light-emitting display device, can be blocked by the linear polarization layer 2222 and the quarter-wave layer 2221. Also, the thickness of the entire passive matrix (PM), bottom emission type organic light-emitting display device can decrease. The grids 2212 facing the direction in which external light is incident are formed of metal-containing graphite, wherein the graphite is doped with from 1 to 10% by weight of metal, so as to reduce the reflection of the external light at the grids 2212. In addition, the linear polarization layer 2222 may further include a low-reflection layer 2213 formed on a surface of each of the grids 2212 that faces the direction in which the external light is incident, so as to further reduce the reflection of the external light.

In certain embodiments, the structures of FIGS. 6 and 8 can be applied as they are to such a passive matrix, bottom emission type display device as described above.

Figure 23:
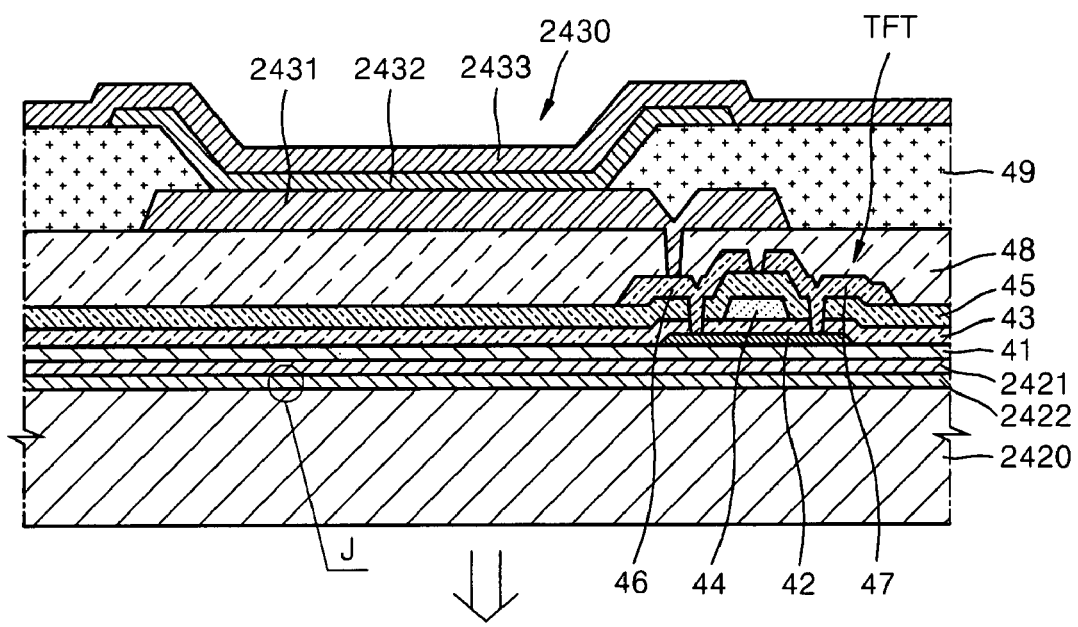
FIGS. 23 and 24 are a sectional view of an active matrix (AM), bottom emission type organic light emitting display device according to an embodiment of the present invention, and an enlarged sectional view of a linear polarizing plate of the active matrix bottom emission type organic light emitting display device of FIG. 23, respectively.

FIG. 23 is a schematic sectional view of an active matrix (AM), bottom emission type organic light-emitting display device according to another embodiment of the present invention.

Referring to FIG. 23, a thin film transistor (TFT) is formed on an upper surface of a substrate 2420. At least one TFT is formed in each of a plurality of pixels and is electrically connected to an organic light-emitting device 2430.

Figure 24:
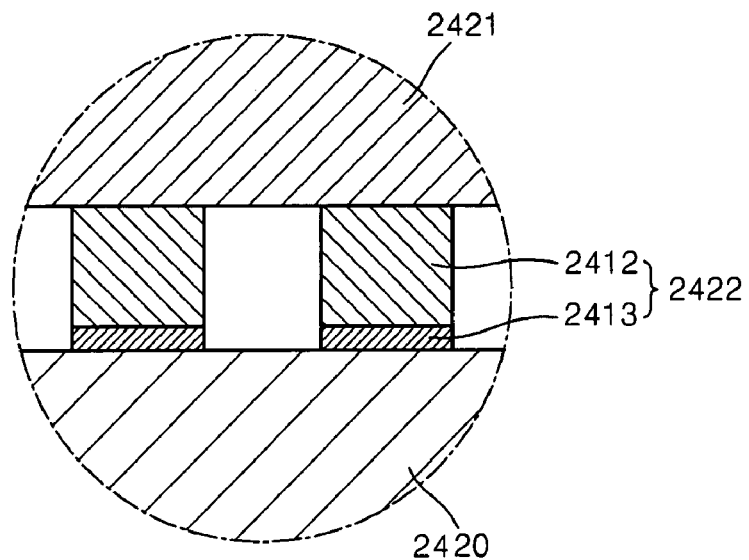

In particular, a linear polarization layer 2422 and a quarter-wave layer 2421 are sequentially formed on the substrate 2420. The organic light-emitting device 2430 includes a first electrode 2431, a second electrode 2433, which are opposed to each other, and an organic emission layer 2432 disposed therebetween. FIG. 24 is an enlarged view of a portion J in FIG. 23 illustrating a detailed structure of the linear polarization layer 2422, according to an embodiment of the present invention. Referring to FIG. 24, a plurality of grids 2412 are formed on the substrate 2420. The grids 2412 are formed of metal-containing graphite, wherein the graphite is doped with from 1 to 10% by weight of metal. The linear polarization layer 2222 may include a low-reflection layer 2413 disposed between the grids 2412 and the substrate 2220.

A buffer layer 41 is formed on the quarter-wave layer 2221, and a semiconductor layer 42 having a pattern that may be predetermined is formed on the buffer layer 41. A gate insulating layer 43 made of $SiO_2$, $SiN_x$, or the like, is formed on the semiconductor layer 42. A gate electrode 44 is formed in a region that may be predetermined on the gate insulating layer 43. The gate electrode 44 is coupled to a gate line by which a TFT on/off signal is applied. An interlayer insulating layer 45 is formed on the gate electrode 44, and a source electrode 46 and a drain electrode 47 are formed so as to respectively contact source and drain regions of the semiconductor layer 42 via contact holes. The TFT thus formed is covered and protected by a passivation layer 48.

The first electrode 2431 that functions as an anode is formed on the passivation layer 48, and a pixel-defining layer 49 is formed of an insulating material so as to cover the first electrode 2431. After an opening that may be predetermined is formed in the pixel-defining layer 49, the organic emission layer 2432 is formed in a region defined by the opening. The second electrode 2433 is then formed so as to cover all the pixels.

In such an active matrix structure, since the linear polarization layer 2422 and the quarter-wave layer 2421 are sequentially stacked on the substrate 2420, reflection of external light incident on a rear surface of the substrate 2420 can be blocked by the linear polarization layer 2422 and the quarter-wave layer 2421. The grids 2412 are formed of metal-containing graphite, wherein the graphite is doped with from 1 to 10% by weight of metal, so that the reflection of external light at the grids 2412 is reduced, and thus the contrast increases. In addition, the linear polarization layer 2422 may include the low-reflection layer 2413 formed on a surface of each of the grids 2412 that faces the direction in which the external light is incident, thereby further reducing the reflection of the external light.

In such an active matrix, bottom emission type organic light-emitting display device, the linear polarization layer 2422 and the quarter-wave layer 2421 can be formed on any suitable surface of the substrate 2420, the TFT, and the organic light-emitting device 2430, provided that the linear polarization layer 2422 is disposed in a direction facing the direction in which external light is incident and the quarter-wave layer 2421 is disposed so as to face the organic light-emitting device 2430. In other words, as shown in FIGS. 6 and 8, after the quarter-wave layer 2421 and the linear polarization layer 2422 may be formed on at least one of the front and rear surfaces of the substrate 2420, the TFT and the organic light-emitting device 2430 may be formed thereon. At least one of the quarter-wave layer 2421 or the linear polarization layer 2422 may be formed at an interface between layers of the TFT.

The passivation layer 48 illustrated in FIG. 23 may not be included in the active matrix (AM), bottom emission type organic light-emitting display device according to an embodiment of the present invention. In this case, the linear polarization layer (e.g., the linear polarization layer 22) and the quarter-wave layer (e.g., the quarter-wave layer 21) can function as the passivation layer 48.

Figure 25:
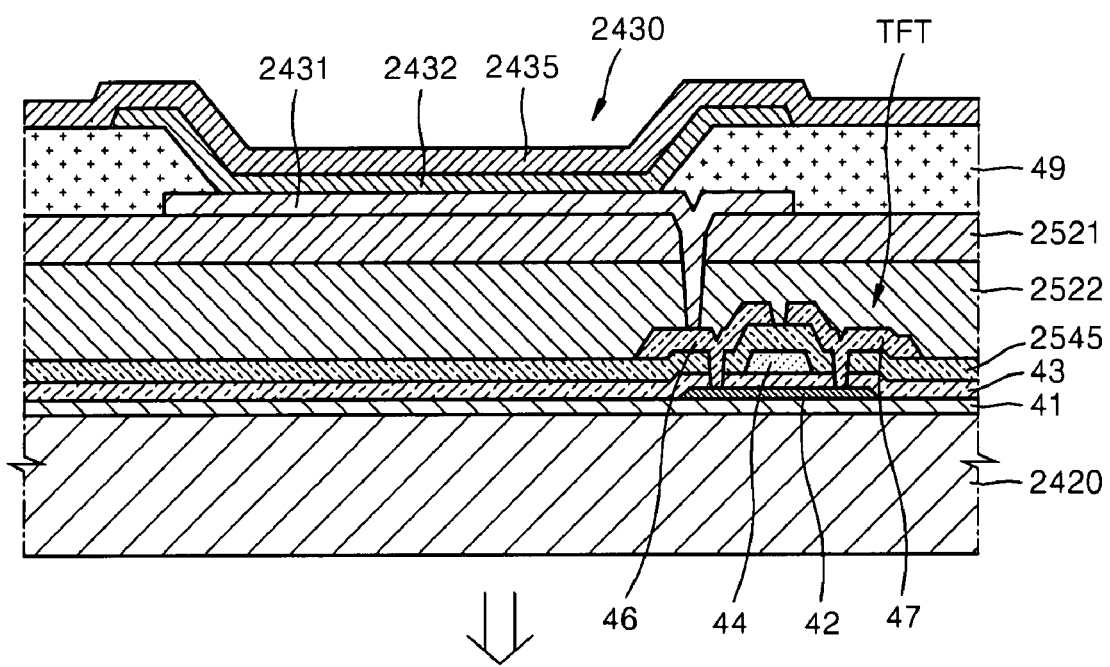
FIG. 25 is a sectional view of an active matrix, bottom emission type organic light emitting display device according to another embodiment of the present invention.

FIG. 25 is a sectional view of an active matrix, bottom emission type organic light emitting display device according to another embodiment of the present invention. Referring to FIG. 25, no passivation layer is formed on the TFT. Instead, a linear polarization layer 2522 and a quarter-wave layer 2521 are sequentially formed on an interlayer insulating layer 2545. Detailed structures and effects of the elements of the present embodiment, which are the same (or substantially the same) as those of previous embodiments, are not repeated here.

Figure 26:
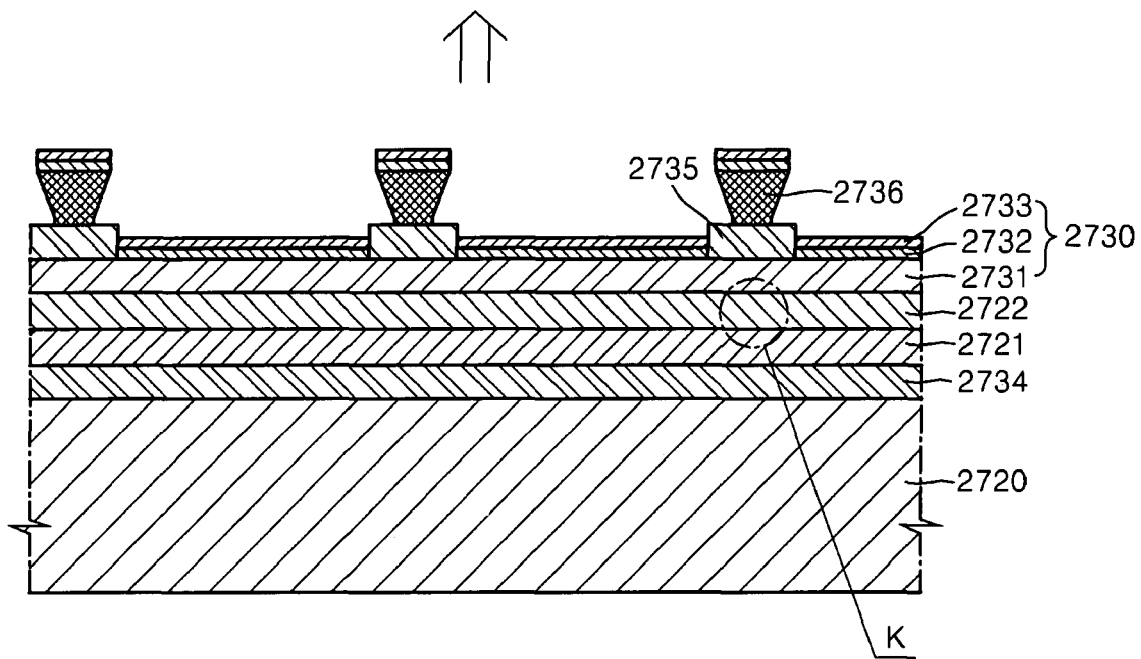
FIGS. 26 and 27 are a sectional view of a passive matrix, top emission type organic light emitting display device according to an embodiment of the present invention, and an enlarged sectional view of the passive matrix top emission type organic light emitting display device of FIG. 26, respectively.

FIG. 26 is a schematic sectional view of a passive matrix, top emission type organic light-emitting display device according to another embodiment of the present invention.

Referring to FIG. 26, a reflection layer 2734 is formed on an upper surface of a substrate 2720, and a quarter-wave layer 2721 and a linear polarization layer 2722 are sequentially formed on an upper surface of the reflection layer 2734. An organic light-emitting device 2730 is formed on the linear polarization layer 2722. The organic light-emitting device 2730 includes a first electrode 2731, a second electrode 2733, which are opposed to each other, and an organic emission layer 2732 disposed therebetween.

Figure 27:
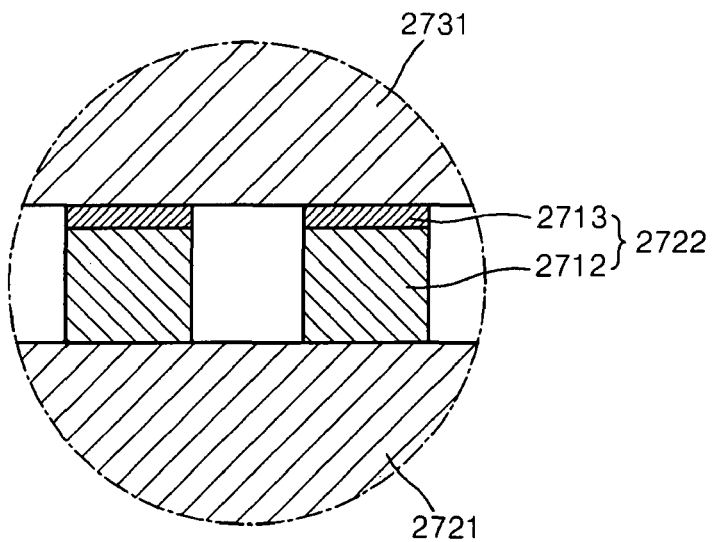

FIG. 27 is an enlarged view of a portion K in FIG. 26 illustrating a detailed structure of the linear polarization layer 2722, according to an embodiment of the present invention. Referring to FIG. 27, a plurality of grids 2712 are formed on the quarter-wave layer 2721. The grids 2712 are formed of metal-containing graphite, wherein the graphite is doped with from 1 to 10% by weight of metal. The linear polarization layer 2722 may include a low-reflection layer 2713 formed on a surface of each of the grids 2712 facing away from the quarter-wave layer 2721. In other words, the low-reflection layer 2713 is formed between the first electrode 2731 and the grids 2712.

The first electrode 2731 having a stripe pattern that may be predetermined is formed on the linear polarization layer 2722, and an internal insulating layer 2735 is formed on the first electrode 2731 so as to cross the stripe pattern of the first electrode 2731. In addition, a separator 2736 is formed on the internal insulating layer 2735 to be perpendicular to the first electrode 2731 in order to pattern the organic emission layer 2732 and the second electrode 2733. A sealing member is formed on the second electrode 2733 so as to seal the organic light-emitting device 2730 from (or away from) external air, moisture. In some cases, the organic emission layer 2732 and the second electrode 2733 may be patterned without using the separator 2736.

In the current embodiment, no reflection of external light occurs so that the contrast is improved. In addition, the thickness of the entire passive matrix, top emission type organic light-emitting display device decreases (e.g., because the quarter-wave layer 2721 and the linear polarization layer 2722 are sequentially formed on (or directly on) the reflection layer 2734, no adhesive layer is required). Detailed structures and effects of the elements of the present embodiment, which are the same (or substantially the same) as those of previous embodiments, are not repeated here.

Although not illustrated, the structures of FIGS. 10 through 20 can be applied as they are to such passive matrix, top emission type organic light-emitting display devices.

Figure 28:
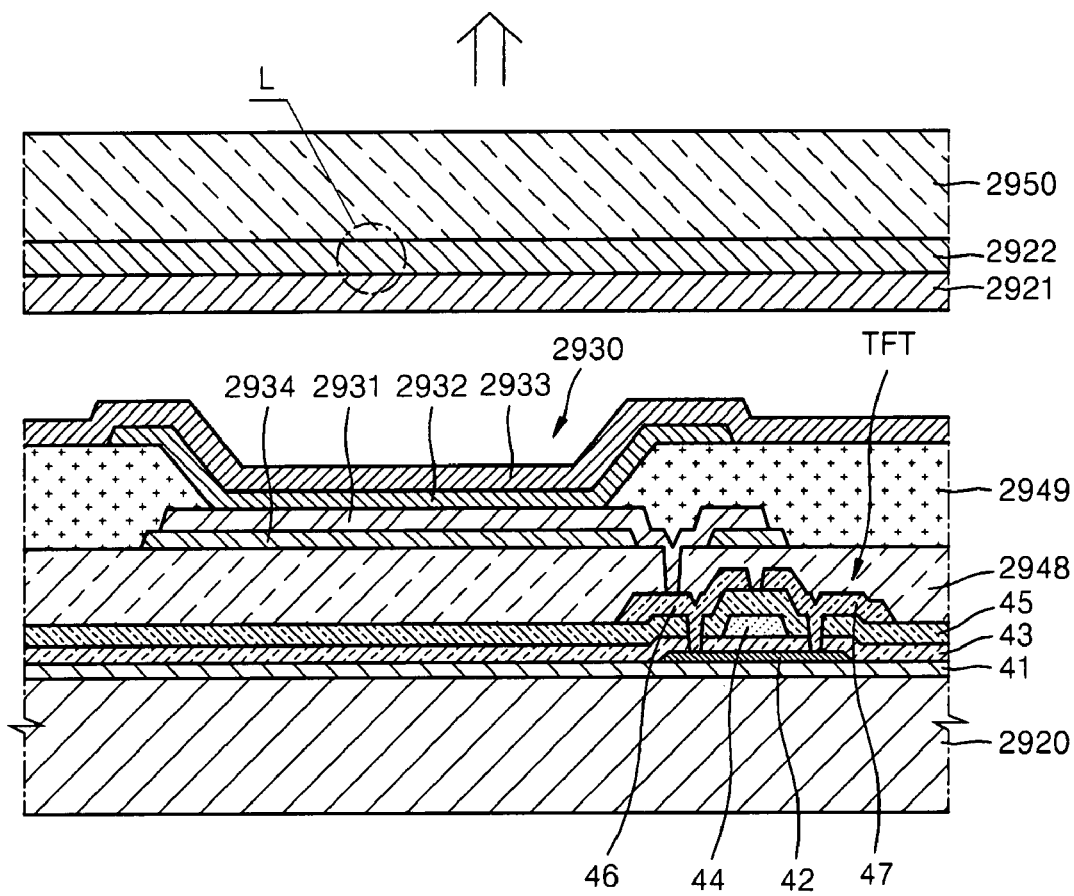
FIGS. 28 and 29 are a sectional view of an active matrix, top emission type organic light emitting display device according to an embodiment of the present invention, and an enlarged sectional view of the active matrix top emission type organic light emitting display device of FIG. 28, respectively.

FIG. 28 is a schematic cross-sectional view of an active matrix, top emission type organic light-emitting display device according to another embodiment of the present invention.

Referring to FIG. 28, a TFT is formed on an upper surface of a substrate 2920. At least one TFT is formed in each of a plurality of pixels and is electrically connected to an organic light-emitting device 2930. The organic light-emitting device 2930 includes a first electrode 2931, a second electrode 2933, which are opposed to each other, and an organic emission layer 2932 disposed therebetween. The structure of the TFT is the same (or substantially the same) as described above with reference to FIG. 23, and thus is not described here.

A passivation layer 2948 is formed on the TFT so as to cover the TFT, and a reflection layer 2934 is formed on the passivation layer 2948. The first electrode 2931 that functions as an anode is formed on the reflection layer 2934, and a pixel-defining layer 2949 is formed of an insulating material so as to cover the first electrode 2931. After forming an opening that may be predetermined in the pixel-defining layer 2949, the organic emission layer 2932 is formed in a region defined by the opening. The second electrode 2933 is then formed so as to cover all the pixels.

Figure 29:
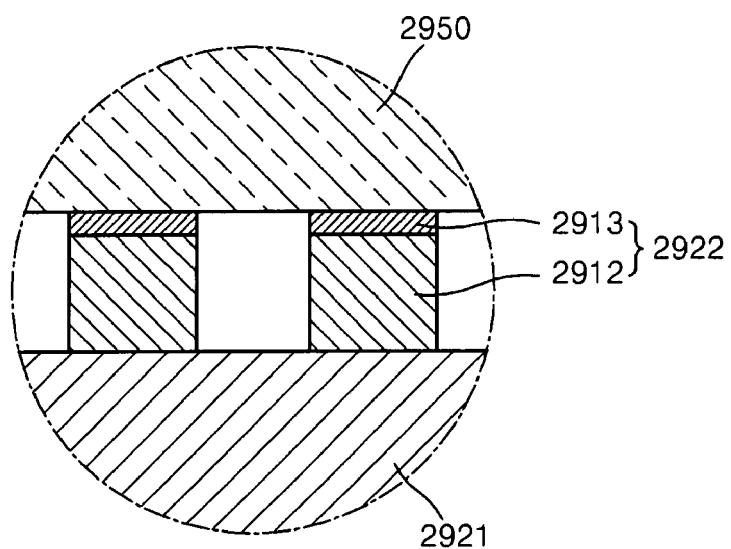

In the embodiment illustrated in FIG. 28, a linear polarization layer 2922 and a quarter-wave layer 2921 are sequentially formed on a surface of a sealing member 2950 facing the organic light-emitting device 2930. FIG. 29 is an enlarged view of a portion L in FIG. 28 illustrating a detailed structure of the linear polarization layer 2922, according to an embodiment of the present invention. Referring to FIG. 29, a plurality of grids 2912 are formed on the quarter-wave layer 2921. The grids 2912 are formed of metal-containing graphite, wherein the graphite is doped with from 1 to 10% by weight of metal.

The linear polarization layer 2922 may include a low-reflection layer 2913 disposed between the sealing member 2950 and the grids 2912.

Reflection of external light incident from above the active matrix, top emission type organic light-emitting display device as illustrated in FIG. 28, is blocked by the linear polarization layer 2922 and the quarter-wave layer 2921. The grids 2912 are formed of metal-containing graphite, wherein the graphite is doped with from 1 to 10% by weight of metal, so that the reflection of the external light at the grids 2912 is reduced. In addition, the linear polarization layer 2922 may include the low-reflection layer 2913 on a surface of each of the grids 2912 that faces a direction in which the external light is incident, thereby further reducing the reflection of the external light. Accordingly, the contrast increases.

In certain embodiments, the structures of FIGS. 10 through 20 can be applied as they are to such active matrix, top emission type organic light-emitting display devices.

The present invention described above is not limited only to organic light-emitting display devices, and can be applied to any other flat display devices that use an inorganic light-emitting device, an LCD, an electron emission device, or the like, as a light-emitting device.

A polarizer and a flat panel display device including the same according to the present invention provide improved contrast and visibility.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A polarizer comprising:
a base; and
a plurality of grids disposed in a stripe pattern on the base, wherein the grids are separated from each other and comprise metal-doped graphite.

2. The polarizer of claim 1, wherein the metal of the grids is selected from the group consisting of aluminum, silver, tungsten, gold, chromium, and combinations thereof.

3. The polarizer of claim 1, further comprising a low-reflection layer disposed on a surface of each of the grids facing a direction in which external light is incident.

4. The polarizer of claim 3, wherein the low-reflection layer has a thickness ranging from about 50 to about 1000 Å.

5. The polarizer of claim 3, wherein the low-reflection layer comprises hydrogen, nitrogen, or combinations thereof.

6. A polarizer comprising:
a base; and
a plurality of grids disposed in a stripe pattern on the base, wherein the grids are separated from each other and comprise metal-containing graphite,
wherein the metal-containing graphite contains from about 1 to about 10% by weight of metal.

7. The polarizer of claim 6, wherein the metal of the grids is selected from the group consisting of aluminum, silver, tungsten, gold, chromium, and combinations thereof.

8. The polarizer of claim 6, further comprising a low-reflection layer disposed on a surface of each of the grids facing a direction in which external light is incident.

9. The polarizer of claim 8, wherein the low-reflection layer has a thickness ranging from about 50 to about 1000 Å.

10. The polarizer of claim 8, wherein the low-reflection layer comprises hydrogen, nitrogen, or combinations thereof.

11. A polarizer comprising:
a base; and
a plurality of grids disposed in a stripe pattern on the base, wherein the grids are separated from each other and comprise metal-doped graphite, and wherein the metal-doped graphite contains from about 1 to about 10% by weight of metal.

* * * * *